United States Patent [19]
Smith

[11] Patent Number: 4,974,698
[45] Date of Patent: Dec. 4, 1990

[54] SPEAKER COVER GRILLE INSTALLATION

[75] Inventor: Donald S. Smith, Union Lake, Mich.

[73] Assignee: Oakwood Metal Fabricating Company, Dearborn, Mich.

[21] Appl. No.: 453,207

[22] Filed: Dec. 26, 1989

Related U.S. Application Data

[63] Continuation-in-part of Ser. No. 419,721, Oct. 11, 1989, abandoned.

[51] Int. Cl.[5] .............................................. H05K 5/00

[52] U.S. Cl. .................................... 181/150; 181/171; 181/175; 381/193

[58] Field of Search ............... 181/148, 150, 175, 199, 181/171, 172; 381/193

[56] References Cited

U.S. PATENT DOCUMENTS 3,041,601 6/1962 Wetzel ............................ 381/193 X
3,859,480 1/1975 Birkner et al. .................. 181/171 X
4,179,009 12/1979 Birkner ........................... 181/150 X
4,325,455 4/1982 Kirkpatrick ......................... 181/148
4,424,881 1/1984 Hattori ............................. 181/156 x
4,503,292 3/1985 Johnson et al. ..................... 381/193

FOREIGN PATENT DOCUMENTS 2056816 3/1981 United Kingdom ................ 181/150

*Primary Examiner*—Benjamin R. Fuller
*Attorney, Agent, or Firm*—John R. Benefiel

[57] ABSTRACT

A frameless pierced metal speaker grille is directly attached to a panel in which a speaker opening is formed by a series of tabs integrally formed in the speaker grille at spaced locations about the perimeter of the grille. Each tab includes a rear facing planar section extending inwardly from a turned edge perimeter of the cover grille and abutted against the panel structure, a v shaped engagement section extending rearwardly from the planar section and having legs adapted to squeeze fit the panel edge adjacent the speaker opening, and an entry section extending rearwardly from the v section and inclined inwardly to cam the tab inwardly at assembly of the grille. The tab shape enables secure spring fitting to the panel structure while being formed of the relatively mild material of the grille material which is pierced as by being perforated to form the open area cover grille.

9 Claims, 2 Drawing Sheets

SPEAKER COVER GRILLE INSTALLATION

CROSS REFERENCE TO RELATED APPLICATIONS

This is a continuation-in-part of application Ser. No. 07/419,721, which was filed on Oct. 11, 1989, now abandoned and is entitled Speaker Cover Grille Installation.

BACKGROUND OF THE INVENTION

This invention concerns attachment methods for mounting a speaker grille to a panel structure in which a speaker opening is formed.

Speakers for audio equipment are normally enclosed for protection, and an opening in the enclosure structure allows for emanation of the sound. This speaker opening is covered with a speaker cover grille or cloth covering.

In automotive applications, the speaker is recessed within an opening in a trim panel, and the cover for the opening must be of a durable, attractive material compatible with the interior trim. The method of attaching the cover must not involve the use of exposed fasteners, as this is considered aesthetically unacceptable in modern auto interior design.

These requirements have led to the use of molded plastic speaker cover grilles using integrally formed assembly features. Perforated metal speaker covers have been used as they provide an attractive appearance, but assembly in auto applications has involved greater cost than for molded plastic covers, as a separate plastic border is required. The plastic border also decreases the open area available for the passage of the sound from the speaker. While spring steel retainer tabs could be used, the addition of these would also increase the cost to be in excess of molded plastic covers.

The metal of the cover itself must be constructed of a mild, cold-rolled steel, in order to be able to be perforated, but this material does not have sufficient resilience to itself act as a conventional spring tab.

SUMMARY OF THE INVENTION

The present invention comprises a speaker cover grille installation in which one or more specially configured gripper tabs are integrally formed from the cover pierced material, extending from a turned edge of the cover grille. Each gripper tab is adapted to be cammed past the speaker opening edge and to thereafter grip the edge by forcing the cover onto the panel structure defining the speaker opening. The speaker cover grille is thereby able to be assembled to the panel by pushing the gripper tab or tabs past the panel opening edge.

Each of the gripper tabs are of a particular configuration, including a rear facing planar section extending parallel to the main area of the cover and inwardly from the turned edge perimeter, abutted against the outer,-face of the panel structure adjacent the speaker opening. A V shaped section extends rearwardly from the planar section having diverging first and second legs adapted to grip the panel opening edge after assembly, An inwardly entry section of the tab extends from the V section inclined from a point beyond the speaker opening to a point within the speaker opening, enabling the tab to be cammed inwardly at assembly to deflect the V section past the edge.

The length of the planar section of each gripper tab allows considerable cantilever bending, deflection of the tab to provide adequate deflection of the V section to occur while limiting deformation of the pierced material well within the yield point limits of the mild material of the speaker cover. Thus, separate tabs of spring steel material are not required, yet a firm strong securement of the cover is achieved by the tab V section engagement with the panel structure.

A separate locating tab is also provided on one side of the speaker cover grille engagable prior to engagement of the gripper tab or tabs to align the cover over the speaker opening.

A low cost but attractive speaker cover installation is thus provided particularly suited to automotive applications.

DETAILED DESCRIPTION

In the following detailed description, certain specific terminology will be employed for the sake of clarity and a particular embodiment described in accordance with the requirements of 35 USC 112, but it is to be understood that the same is not intended to be limiting and should not be so construed inasmuch as the invention is capable of taking many forms and variations within the scope of the appended claims.

Figure 1:
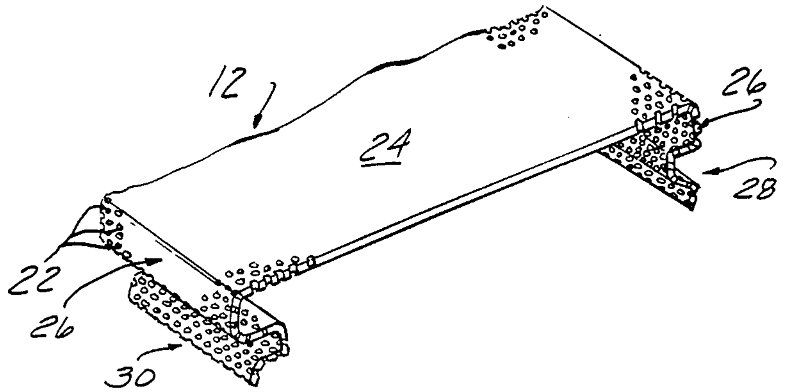
FIG. 1 is a fragmentary perspective view of a transverse section through a speaker cover grille illustrating the configuration of the gripper tabs and a locator tab.
Figure 2:
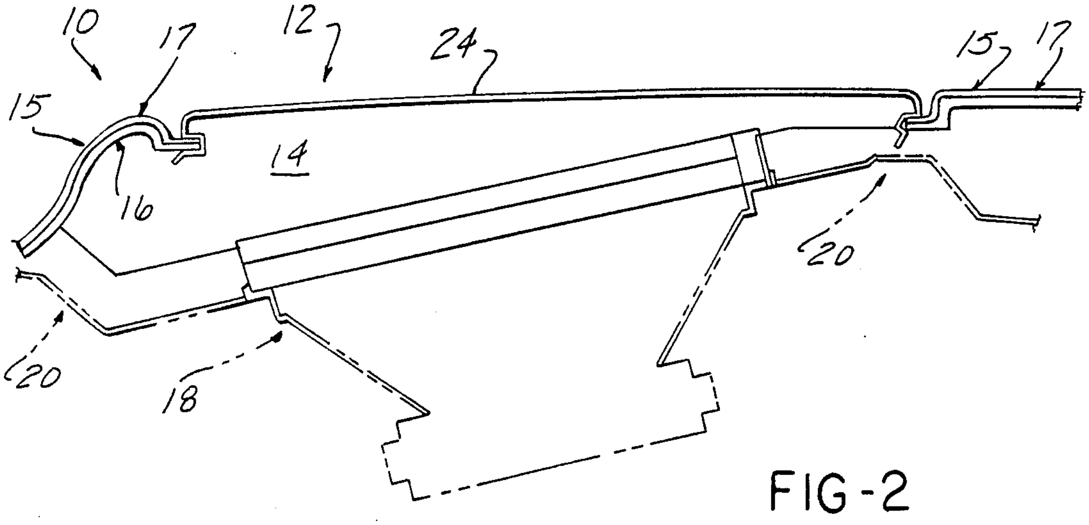
FIG. 2 is a transverse sectional view of an installed speaker cover and adjacent panel structure, with a speaker shown in phantom.
Figure 3:
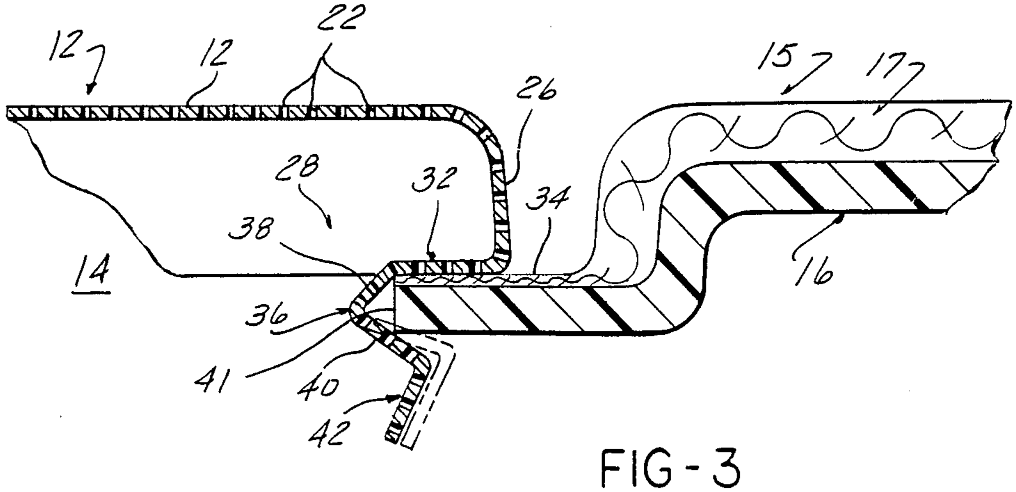
FIG. 3 is an enlarged fragmentary sectional view through a gripper tab and mating edge of the adjacent panel structure, showing the relaxed condition of the tab V section in phantom.

Referring to the drawings, and particularly FIGS. 1–3, a speaker cover grille installation 10 is shown, in which a formed cover grille 12 is secured over a speaker opening forming a panel structure 15, here comprised of a substrate 16 and carpet 17. A speaker assembly 18 is mounted as by bracketing 20 so as to allow sound waves to emanate through the opening 14 and cover grille 12.

The cover grille 12 is formed of a sheet material which has been pierced as by being perforated by a punching operation to form a pattern of openings extending completely across the area of the cover grille 12. An open area is thus provided allowing the transmission of sound therethrough. Cold rolled low carbon sheet steel is required to allow the punching of perforations 22 therein since spring steel cannot easily be punched with small diameter holes. For minimum distortion 40–50% open area should be provided, 43% having been found to be optimal for transmitting the speaker sounds therethrough.

The cover grille 12 is comprised of a generally planar main area 24 having a turned edge 26 extending around the perimeter thereof presenting a smooth, substantial appearance.

According to the concept of the present invention, one or more gripping tabs 28 are integral with the formed edge 26, opposite a locating hinge tab 30, also integral with the formed edge 26.

Each gripping tab 28 includes an inwardly extending planar section 32 being generally parallel to said central section 26 so as to be positioned abutting against the face 34 of the edge of the panel structure 15 adjacent the speaker opening 14. The planar section 32 extends inwardly a sufficient distance to locate a V section 36 within opening 14. V section 36 extends rearwardly from the planar section 32 when the cover grille 12 is installed.

The V section 36 includes, a pair of legs 38, 40, leg 38 inclined inwardly and rearwardly away from the main area 24, leg 40 inclined outwardly and rearwardly. The spacing of the V section 36 is sized to grip the thickness of the panel structure 15 at the edge of the opening 14 when the cover grille 12 is installed.

An entry section 42 forms the terminus of the gripping tab 28, and extends inwardly at an inclination to the plane of the opening 14. The entry section extends from a point outside the opening 14 to a point inside the opening so as to engage the edge 41 of the opening 14 when the cover grille 12 is placed against the panel section 15.

The entry section 42 in engaging the edge of panel section 15 adjacent the opening 14, when installed acts to cam the gripping tab 28 inwardly as the cover grille 12 is pushed against the panel structure 12.

The gripping tab 28 is able to undergo considerable deflection inwardly while remaining within the yieldable limits of the cover material by the presence of the planar section 32, which is of a length greater than the gripper tab 28. The planar section 33 is in effect cantilevered and will thus hinge about the line of connection with the remaining portion of the turned edge 26 as well as bending along its length. This allows considerable shifting of the V section 36 inwardly to enable it to pass into the opening 14.

The legs 38 and 40 are spread slightly when seating on the edge of the panel structure 15 adjacent the opening 14 to themselves grip the panel edge and hold it firmly against the underside of the planar section 32.

Thus, a secure mounting of the cover grille 12 to the panel structure 15 is achieved.

The locating tab 30 is initially seated on the edge at installation, and the cover grille 12 hinged thereabout to bring the entry section 42 of the gripping tab or tabs into engagement with the panel structure 15.

The locating tab 30 thus serves to correctly position the cover grille 12 to be aligned over the opening 14 for proper engagement of the gripping tab or tabs 28.

At least one gripper tab 28 is provided opposite a single locating tab 30. Additional gripper tabs 28 may be formed on the lateral sides to increase the retention force acting on the installed cover grille 12.

Since the tabs 28 and 30 are integrally formed of the material of the cover grille 12, the proper deflection resistance will depend on the bendability of that material. It is important to avoid bending past the yield point to insure adequate retention forces. The bendability of the perforate material will of course depend on its thickness and the geometry of the hole pattern.

Proper resistance was found over a range of thicknesses from 0.018 to 0.020 inches of cold rolled mild steel, when a hole pattern ranging from 0.038 inch diameter holes on 0.055 inches staggered centers to 1/16 of an inch on 3/32 of a inch hole centers. The thicker material must be used with the reduced bridge size of the larger holes. Selection of a hole pattern is a matter of aesthetic appeal. The length of the gripper tabs 28 can also extend for a considerable proportion of the side of the cover grille 12 on which it is formed, and their stiffness can be varied by selection of the proper length.

Figure 4:
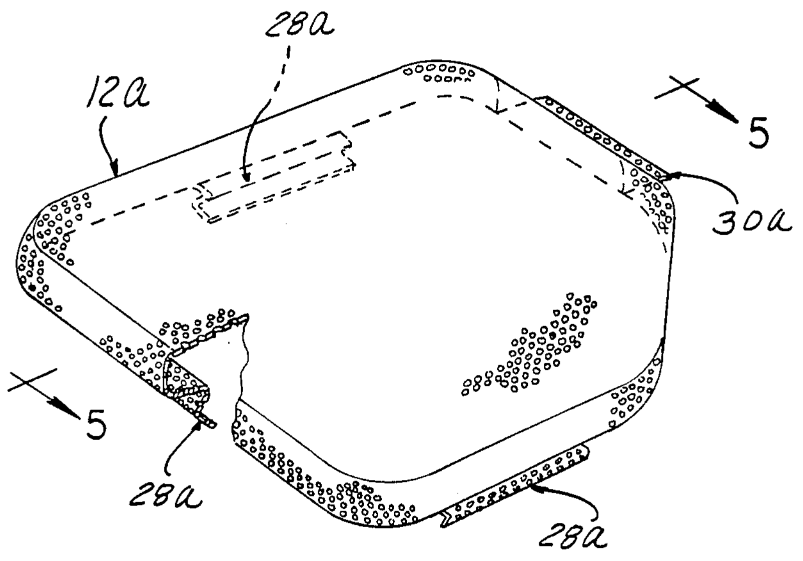
FIG. 4 is a perspective view of an alternate speaker cover grille configuration using a locator tab of a different shape.
Figure 5:
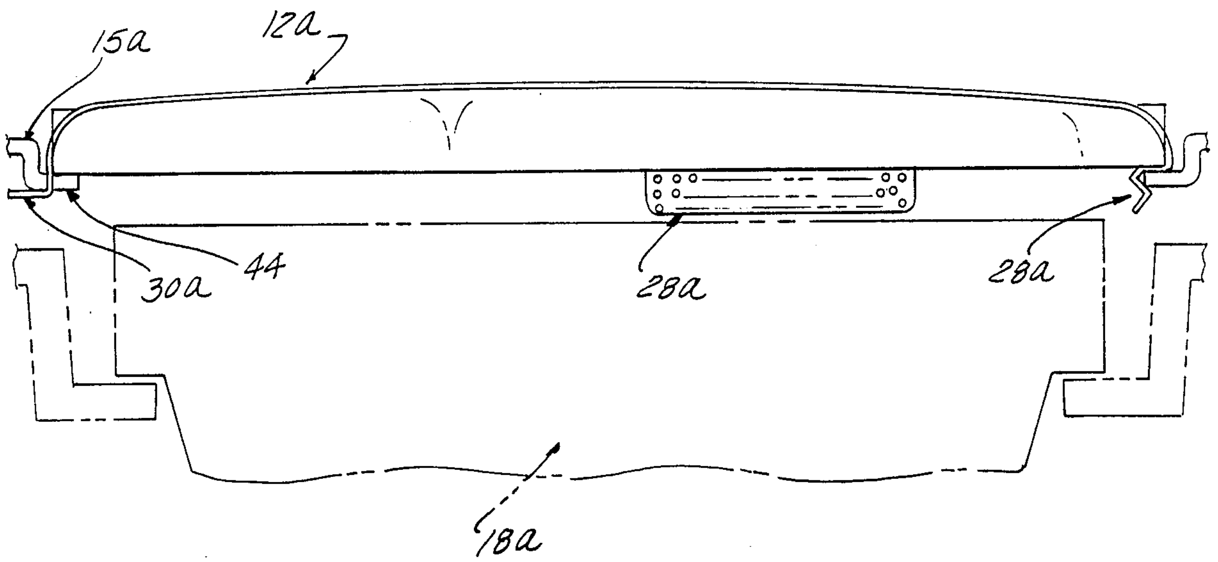
FIG. 5 is a transverse sectional view of the speaker cover grille installed in a panel structure, with the speaker assembly shown in phantom.

FIGS. 4 and 5 show another typical installation using the concept of the invention. In this example, the cover grille 12*a*, has a locating tab 30*a* comprised of a straight section extending outwardly which is received in a recess 44 in the panel structures 15*a*.

Three gripper tabs 28*a* are formed on the cover grille 12*a* of FIG. 4, the gripper tab 28*a* opposite the locating tab 30*a* extending for most of the length of that side to achieve proper stiffness.

Accordingly, it will be appreciated that by this construction a low cost metal speaker cover grille installation is achieved, not necessitating separate plastic frame pieces or welded spring steel tabs.

While a polygonal cover is shown in which the tabs are formed on a respective side, other shapes accommodating such integrally formed tabs are possible.

Also, while a perforate material has been described, the cover grille could be formed of an expanded sheet metal to accomplish the same function of sound transmission.

I claim:

1. A speaker cover grille installation for covering an opening in a panel structure with a cover grille of a greater size than said opening, in which a speaker assembly is mounted behind said opening, said cover grille installation comprising:

a cover grille comprised of a formed sheet of pierced sheet metal completely covered with a pattern of openings to create an open area allowing transmission of sound therethrough, said cover grille having a central generally planar portion and an integral formed turned edge extending about a perimeter of said generally planar portion;

said cover grille having at least one gripper tab integrally formed from said formed turned edge of pierced metal, said gripper tab extending from said formed edge in a direction generally normal to said central generally planar portion, and having a gripper portion extending out beyond said opening with said cover grille in an aligned position with said opening, said tab also including an entry portion integral with said gripper portion located and adapted to be pushed inwardly by an edge of said panel structure adjacent said opening to allow said gripper portion to move through said opening, whereby said gripper tab is adapted to grip the edge of said panel structure adjacent said opening upon pushing said cover grille against said panel structure when aligned with said opening.

2. The speaker cover grille installation according to claim 1 wherein said gripper tab includes a first planar section extending inwardly from a perimeter of said turned edge to be generally parallel to said planar central portion and a V section extending from said planar section to form said gripper portion, said V section including a first leg extending inwardly and rearwardly from said planar section, and a second leg extending outwardly past said opening and rearwardly therefrom to form a V, said planar section extending inwardly to position said V section at the edge of said panel structure adjacent said opening with said cover grille aligned thereover;

said gripper tab entry portion extending rearwardly and inwardly from said second leg of said V section from a point outside said opening to a point within said opening, whereby said gripper tab is cammed outwardly when said cover grille is pushed against said panel structures by the edge of said panel structure adjacent said opening engaging said entry portion.

3. The speaker, cover grille installation according to claim 2 wherein said V section is spread to grip said panel structure edge when said speaker cover grille is installed.

4. The speaker cover grille installation according to claim 1 wherein said speaker cover grille is formed of mild steel sheet material.

5. The speaker cover grille installation according to claim 2 wherein said speaker cover grille is polygonal in shape and said gripper tab is formed on one side thereof and extends for a substantial proportion of the length of said side.

6. The speaker cover grille installation according to claim 1, wherein said at least one gripper tap extends from a limited portion of said turned edge, and said cover grille, further including a locating tab integrally formed and extending from another portion of said turned edge opposite said at least one gripper tab, said locating tab engaging said panel structure adjacent said opening to align said speaker cover grille gripper tab.

7. The speaker cover grille installation according to claim 6 further including additional gripper tabs on sides adjacent said locating tab and said at least one gripper tab.

8. A speaker cover grille comprising:

a sheet of pierced mild steel formed with a pattern of openings creating an open area to allow transmission of sound therethrough, said pattern substantially covering a full extent of said cover grille, said cover grille having a generally planar central portion and an inwardly turned edge about a perimeter thereof;

at least one gripper tab integrally formed to extend from said inwardly turned edge;

said at least one gripper tab including a first planar section extending inwardly from said edge generally parallel to said central portion, a V section having a first leg extending rearwardly and away from said central portion and a second leg extending rearwardly and also away from said central portion, and an entry portion integrally connected to said second leg and extending rearwardly from said second leg and toward said central portion.

9. A speaker cover grille installation according to claim 8 further including a locating tab formed integrally from said sheet of pierced mild steel and extending from said turned edge opposite said at least one gripper tab.

* * * * *